(12) United States Patent
Seebacher et al.

(10) Patent No.: US 10,778,156 B2
(45) Date of Patent: Sep. 15, 2020

(54) INTERSTAGE MATCHING NETWORK

(71) Applicant: Infineon Technologies AG, Neubiberg (DE)

(72) Inventors: David Seebacher, Villach (AT); Christian Schuberth, Villach-Landskron (AT); Peter Singerl, Villach (AT); Ji Zhao, Villach (AT)

(73) Assignee: Infineon Technologies AG, Neubiberg (DE)

( * ) Notice: Subject to any disclaimer, the term of this patent is extended or adjusted under 35 U.S.C. 154(b) by 177 days.

(21) Appl. No.: 15/627,880

(22) Filed: Jun. 20, 2017

(65) Prior Publication Data

US 2018/0367104 A1    Dec. 20, 2018

(51) Int. Cl.
*H03F 3/68* (2006.01)
*H03F 1/56* (2006.01)
(Continued)

(52) U.S. Cl.
CPC ............. *H03F 1/565* (2013.01); *H01L 23/66* (2013.01); *H01L 24/48* (2013.01); *H01L 24/49* (2013.01); *H01L 25/072* (2013.01); *H01L 29/2003* (2013.01); *H01L 29/7787* (2013.01); *H01L 29/7816* (2013.01); *H03F 1/0288* (2013.01); *H03F 3/195* (2013.01); *H01L 2223/6611* (2013.01); *H01L 2223/6655* (2013.01);
(Continued)

(58) Field of Classification Search
CPC ........ H03F 1/565; H03F 3/195; H03F 1/0288; H03F 2200/222; H03F 2200/451
USPC .......... 330/302, 124 R, 295; 333/32
See application file for complete search history.

(56) References Cited

U.S. PATENT DOCUMENTS

| | | | |
|---|---|---|---|
| 7,728,662 B2* | 6/2010 | Apel | H03F 1/0244 330/124 D |
| 8,004,371 B2* | 8/2011 | Beaudin | H03H 9/542 330/124 R |

(Continued)

FOREIGN PATENT DOCUMENTS

DE    102017114368 A1    12/2017

OTHER PUBLICATIONS

Doherty, W. H., "A New High Efficiency Power Amplifier for Modulated Waves", Proceedings of the Institute of Radio Engineers, vol. 24, No. 9, Sep. 1936, pp. 1163-1182.

*Primary Examiner* — Khanh V Nguyen
*Assistant Examiner* — Khiem D Nguyen
(74) *Attorney, Agent, or Firm* — Murphy, Bilak & Homiller, PLLC

(57) ABSTRACT

A circuit includes a first power transistor stage internally configured to function as a voltage-controlled current source, a second power transistor stage having an input impedance which varies as a function of input power and an interstage matching network coupling an output of the first power transistor stage to an input of the second power transistor stage. The interstage matching network is configured to provide impedance inversion between the input of the second power transistor stage and the output of the first power transistor stage. The impedance inversion provided by the interstage matching network transforms the first power transistor stage from functioning as a voltage-controlled current source to functioning as a voltage-controlled voltage source at the input of the second power transistor stage.

15 Claims, 10 Drawing Sheets

(51) Int. Cl.

| | |
|---|---|
| *H01L 23/00* | (2006.01) |
| *H01L 23/66* | (2006.01) |
| *H01L 25/07* | (2006.01) |
| *H01L 29/20* | (2006.01) |
| *H01L 29/778* | (2006.01) |
| *H01L 29/78* | (2006.01) |
| *H03F 1/02* | (2006.01) |
| *H03F 3/195* | (2006.01) |

(52) U.S. Cl.
CPC ............... *H01L 2224/48137* (2013.01); *H01L 2224/48195* (2013.01); *H01L 2224/49171* (2013.01); *H01L 2224/49175* (2013.01); *H01L 2924/00014* (2013.01); *H01L 2924/13091* (2013.01); *H03F 2200/222* (2013.01); *H03F 2200/318* (2013.01); *H03F 2200/451* (2013.01)

(56) References Cited

U.S. PATENT DOCUMENTS

| | | | | |
|---|---|---|---|---|
| 8,432,237 | B2 * | 4/2013 | Klemens | ................... H03F 1/56 |
| | | | | 333/126 |
| 2005/0110576 | A1 * | 5/2005 | Rhodes | ................... H03F 3/217 |
| | | | | 330/305 |
| 2010/0001802 | A1 * | 1/2010 | Blednov | ............... H03F 1/0288 |
| | | | | 330/295 |
| 2012/0194276 | A1 * | 8/2012 | Fisher | ................ H01L 27/0605 |
| | | | | 330/296 |
| 2017/0063308 | A1 | 3/2017 | Seebacher et al. | |

\* cited by examiner

INTERSTAGE MATCHING NETWORK

TECHNICAL FIELD

The present application relates to interstage matching networks for power transistor stages, in particular interstage matching networks which mitigate nonlinear effects associated with high performance semiconductor technologies.

BACKGROUND

Mobile RF communication systems are trending towards smaller cell sizes and more power amplifiers with lower power, e.g. 5G (5th generation) mobile networks, wireless systems and MIMO (multiple input, multiple output) systems, etc. Physical space requirements can be reduced by integrating more parts of the system. For the RF power amplifier, this means significant challenges in both efficiency and linearity. Modern high-power technologies such as GaN and LDMOS (Laterally Diffused MOSFET) offer superior efficiency performance, but impose serious challenges in terms of linearity. Accordingly, trade-offs such as gain/loss versus linearity must be made.

Conventional interstage matching networks for coupling the final stage of an RF communication system to a driver stage are typically designed to transform the gate input impedance of the final stage to a specific load impedance for the driver. Traditionally, the phase of the interstage matching network is ignored in the design process since the phase of the interstage matching network does not matter for a final stage having a constant or nearly constant input impedance. However, higher power and higher frequency semiconductor technologies such as GaN have an input impedance that varies significantly with input power, causing a large variation in the load impedance for the driver and hence changing gain and phase significantly. An improved interstage matching network suited for high performance semiconductor technologies is needed.

SUMMARY

According to an embodiment of a circuit, the circuit comprises a first power transistor stage internally configured to function as a voltage-controlled current source, a second power transistor stage having an input impedance which varies as a function of input power, and an interstage matching network coupling an output of the first power transistor stage to an input of the second power transistor stage. The interstage matching network is configured to provide impedance inversion between the input of the second power transistor stage and the output of the first power transistor stage. The impedance inversion provided by the interstage matching network transforms the first power transistor stage from functioning as a voltage-controlled current source to functioning as a voltage-controlled voltage source at the input of the second power transistor stage.

According to an embodiment of a semiconductor package, the semiconductor package comprises: a first semiconductor die comprising a first power transistor stage internally configured to function as a voltage-controlled current source, the first semiconductor die being mounted to a substrate; a second semiconductor die comprising a second power transistor stage having an input impedance which varies as a function of input power, the second semiconductor die being mounted to the substrate; and an interstage matching network coupling an output of the first power transistor stage to an input of the second power transistor stage. The interstage matching network is configured to provide impedance inversion between the input of the second power transistor stage and the output of the first power transistor stage. The impedance inversion provided by the interstage matching network transforms the first power transistor stage from functioning as a voltage-controlled current source to functioning as a voltage-controlled voltage source at the input of the second power transistor stage. Part of the interstage matching network is formed by bond wire connections between the first and the second semiconductor dies.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide an interstage matching network which reduces the impact of nonlinear effects associated with high performance semiconductor technologies. The interstage matching network couples the output of a first power transistor stage to the input of a second power transistor stage. The first power transistor stage is internally configured to function as a voltage-controlled current source, and the second power transistor stage has an input impedance which varies as a function of input power. The interstage matching network is designed such that the first power transistor stage externally functions like a voltage-controlled voltage source instead of a voltage-controlled current source at the input of the second power transistor stage, forcing a desired (gate) input voltage at the second power transistor stage in terms of amplitude and phase. The interstage matching network reduces the impact of changing input impedance of the second power transistor stage, improving linearity of the system.

Figure 1:
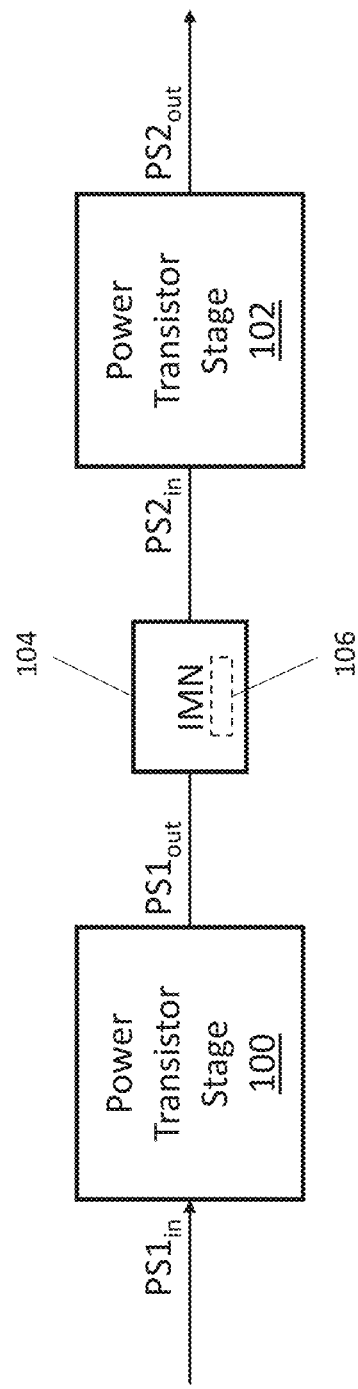
FIG. 1 illustrates a block diagram of an embodiment of a circuit that includes first and second power transistor stages and an interstage matching network coupling the output of the first power transistor stage to the input of the second power transistor stage.

FIG. 1 illustrates an embodiment of a circuit that comprises a first power transistor stage 100 having an input $PS1_{in}$ and an output input $PS1_{out}$, a second power transistor stage 102 having an input $PS2_{in}$ and an output input $PS2_{out}$, and an interstage matching network (IMN) 104 coupling the output $PS1_{out}$ of the first power transistor stage 100 to the input $PS2_{in}$ of the second power transistor stage 102. The first power transistor stage 100 is internally configured to function as a voltage-controlled current source, and the second power transistor stage 102 has an input impedance which varies as a function of input power.

In some embodiments, the first power transistor stage 100 is a driver stage and the second power transistor stage 102 is a final amplifier stage e.g. of an RF communication system. In other embodiments, the first power transistor stage 100 is a pre-driver stage and the second power transistor stage 102 is another pre-driver stage or a driver stage for a final amplifier stage e.g. of an RF power amplifier. Still other power transistor stage configurations are contemplated for use with the interstage matching network 104.

The interstage matching network 104 is configured to provide impedance inversion between the input $PS2_{in}$ of the second power transistor stage 102 and the output $PS1_{out}$ of the first power transistor stage 100. To this end, the interstage matching network 104 includes an impedance inverter 106 such as a quarter-wave impedance transformer, PI network or equivalent circuit T which couples the input $PS2_{in}$ of the second power transistor stage 102 to the output $PS1_{out}$ of the first power transistor stage 100. The input impedance of the second power transistor stage 102 is inverted to a load impedance at the output $PS1_{out}$ of the first power transistor stage 100 by the impedance inverter 106. The first power transistor stage 100 internally functions as a voltage-controlled current source which acts like an open circuit. The impedance inversion provided by the interstage matching network 104 transforms the first power transistor stage from functioning as a voltage-controlled current source to functioning as a voltage-controlled voltage source at the input $PS2_{in}$ of the second power transistor stage 102, by converting the internal open circuit to a short circuit which forces a fixed voltage at the input $PS2_{in}$ of the second power transistor stage 102. This way, a (quasi) voltage source and not a (quasi) current source drives the input $PS2_{in}$ of the second power transistor stage 102.

For a second power transistor stage 102 having an input impedance that varies greatly as a function of input power, the nonlinear effects associated with such input impedance variation is reduced by driving the input $PS2_{in}$ of the second power transistor stage 102 with an element that functions more like a voltage source than a current source. For example, with a second power transistor stage 102 comprising one or more power transistors fabricated from a III-V semiconductor technology such as GaN, the input impedance of the second power transistor stage 102 varies greatly as a function of input power.

The variable input impedance of the second power transistor stage 102 appears as a variable load impedance to the first power transistor stage 100, unless the input impedance variation of the second power transistor stage 102 is mitigated. More particularly, the variable input impedance of the second power transistor stage 102 changes the imaginary part of the impedance seen at that output $PS1_{out}$ of the first power transistor stage 100. This in turn significantly changes the output phase of the first power transistor stage 100, causing significant (phase) AM/PM and (gain) AM/AM distortion if unmitigated.

Figure 2B:
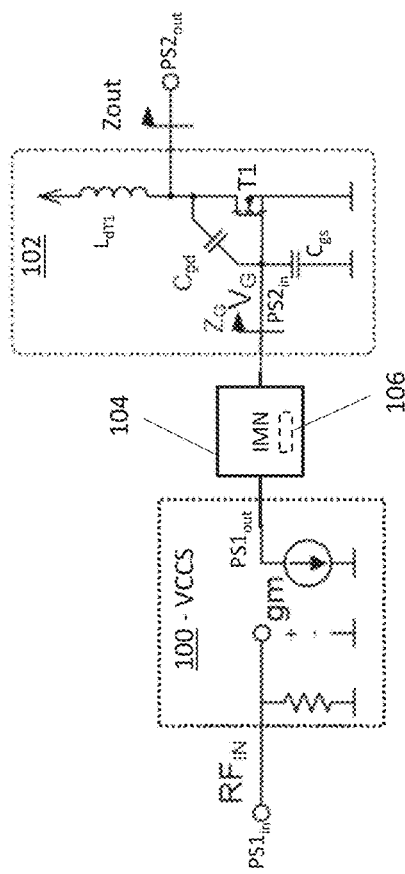
FIG. 2B illustrates a schematic diagram of the circuit of FIG. 1, with the interstage matching network transforming the first power transistor stage from functioning as a voltage-controlled current source to functioning as a voltage-controlled voltage source at the input of the second power transistor stage.
Figure 2A:
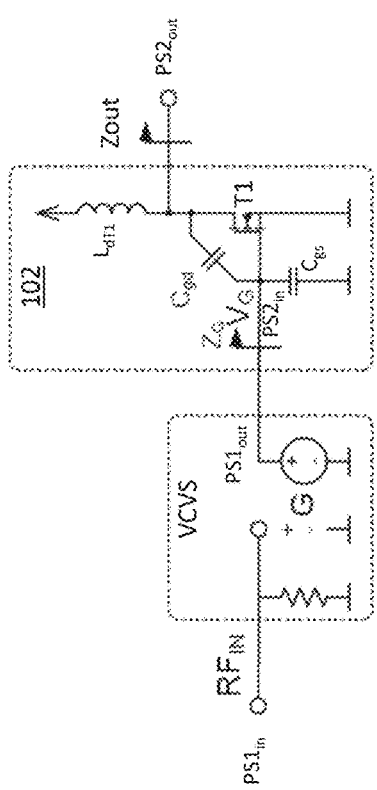
FIG. 2A illustrates a schematic diagram of the circuit of FIG. 1, with the first power transistor stage configured as an ideal voltage-controlled voltage source.

Ideally, the first power transistor stage 100 would be configured to function as a voltage-controlled voltage source (VCVS) as shown in FIG. 2A where the second power transistor stage 102 is illustrated as the final amplifier stage of an RF communication system and the ideal VCVS is illustrated as a driver for the final amplifier stage, and where $C_{gs}$ is the gate-to-source capacitance of the RF power transistor device T1 included in the second power transistor stage 102, $C_{gd}$ is the gate-to-drain capacitance of RF power transistor device T1 and $L_{dT1}$ is the drain bias feed inductance for transistor device T1. The gate voltage $V_G$ of the RF power transistor device T1 included in the second power transistor stage 102 determines the output current of the second power transistor stage 102. Hence, the desire for the first power transistor stage 100 to function as a VCVS.

However, the first power transistor stage 100 acts more like a current source than a voltage source due to the use of transistor devices. The impedance inversion provided by the interstage matching network 104 between the input $PS2_{in}$ of the second power transistor stage 102 and the output $PS1_{out}$ of the first power transistor stage 100 transforms the first power transistor stage 100 from functioning as a voltage-controlled current source (VCCS) to functioning as a voltage-controlled voltage source (VCVC) at the input $PS2_{in}$ of the second power transistor stage 102, as illustrated in FIG. 2B. This way, the gate voltage $V_G$ of the power transistor device T1 remains relatively unchanged even though the input impedance of the second power transistor stage 102 may change as a function of input power, e.g., in the case of Q1 being a high-performance power transistor device such as an LDMOS transistor or HEMT (high-electron mobility transistor). By mitigating the large input impedance variation of the second power transistor stage 102, the interstage matching network 104 maintains good linearity performance.

In the case of an RF amplifier design for an RF communication system, the second power transistor stage 102 may be the final RF power amplifier stage and the first power transistor stage 100 may be the driver for the final stage. As explained above, optimum driver behaviour for coping with large input impedance variation of the final RF power amplifier stage would be for the first power transistor stage 100 to function as an ideal voltage-controlled voltage source (VCVS) as illustrated in FIG. 2A. However, the first power transistor stage 100 includes transistors which cause the first stage 100 to internally function more like a voltage-controlled current source (VCCS) than a VCVS. However, by including the impedance inverter 106 in the interstage matching network 104 for coupling the input $PS2_{in}$ of the second power transistor stage 102 to the output $PS1_{out}$ of the first power transistor stage 100, a driver stage for an RF amplifier can be transformed from a (quasi) current source to a (quasi) voltage source at the RF amplifier input as illustrated in FIG. 2B. This way, the nonlinear gate input impedance $Z_G$ of the final RF power amplifier stage has little or no impact on the driver stage, and the final stage drain current is solely defined by the driver input power $RF_{IN}$.

In one embodiment, the driver stage of an RF amplifier design comprises an LDMOS transistor that functions as a voltage-controlled current source and the RF power amplifier stage comprises a III-V semiconductor transistor such as a GaN HEMT configured as an RF power amplifier. In another embodiment, the driver stage comprises a first LDMOS transistor that functions as a voltage-controlled current source and the RF power amplifier stage comprises a second LDMOS transistor configured as an RF power amplifier. In yet another embodiment, the driver stage comprises a first III-V semiconductor transistor such as a GaN HEMT that functions as a voltage-controlled current source and the RF power amplifier stage comprises a second III-V semiconductor transistor such as a GaN HEMT configured as an RF power amplifier. In each case, the impedance inverter 106 of the interstage matching network 104 transforms the driver stage from functioning as a current source to functioning as a voltage source at the input of the RF power amplifier stage.

In more detail, the interstage matching network 104 transforms the internal current source of the first power transistor stage 100, including all matching elements in between, to act like a voltage source at the input $PS2_{in}$ of the second power transistor stage 102. The interstage matching network 104 accounts for all gate (e.g. $C_{gs}$) and drain (e.g. $C_{gd}$) parasitics and corresponding biasing elements (e.g. $L_{dT1}$) of the circuit. In one embodiment, the interstage matching network 104, including the device parasitics, has a phase response of 90°+180° *n where n is an integer greater than or equal to zero. For example, the phase response of the interstage matching network 104 can be 90°, 270°, 450° etc. However, longer phases have a more narrowband frequency response. That is, a 270° phase has a narrower band response compared to a 90° phase.

In one embodiment, the impedance inverter 106 of the interstage matching network 104 is a quarter-wave impedance transformer such as a quarter-wave transmission line or waveguide. A quarter-wave impedance transformer inverts the input impedance of the second power transistor stage 102 as given by:

$$Z_{PS1}=Z_0^2/Z_G$$

where $Z_{PS1}$ is the load impedance at the output $PS1_{out}$ of the first power transistor stage 100, $Z_G$ is the input impedance of the second power transistor stage 102 and $Z_0$ is the characteristic impedance of the transmission line. In another embodiment, the impedance inverter 104 is a PI network which approximates a quarter-wave impedance transformer. In yet another embodiment, the impedance inverter 104 is formed by an equivalent circuit T.

Figure 3:
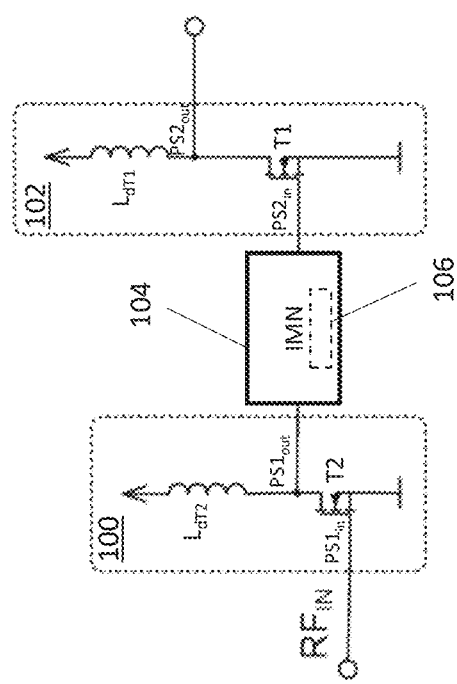
FIG. 3 illustrates a schematic diagram of the circuit of FIG. 1, configured as a single-cell interstage IMN implementation.
Figure 4:
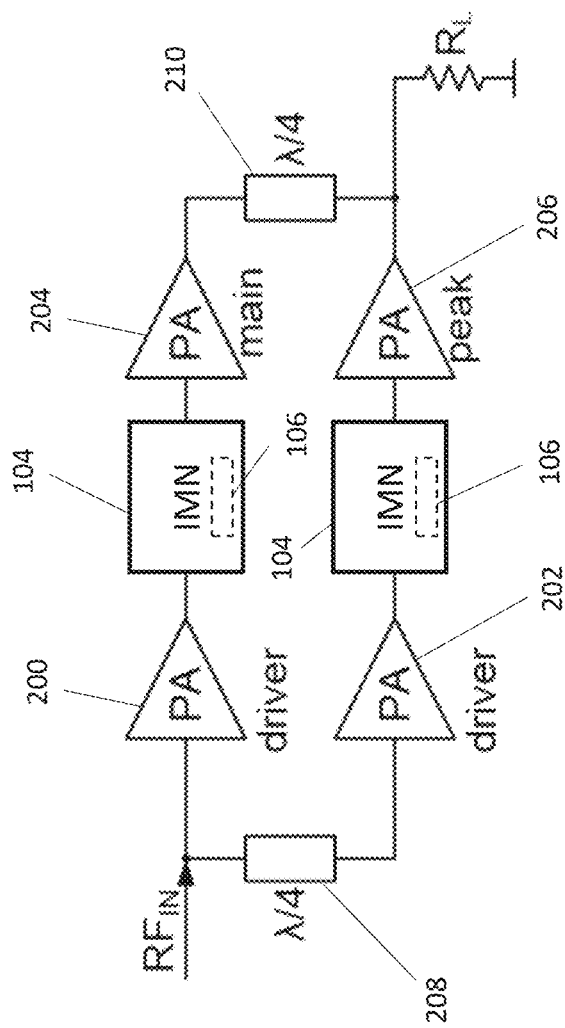
FIG. 4 illustrates a schematic diagram of the circuit of FIG. 1, configured as a dual line-up Doherty design.

FIG. 3 illustrates a general schematic overview of a single-cell interstage IMN implementation. Such a topology can be used, e.g., for main and peaking amplifiers in a dual line-up Doherty design, as illustrated in FIG. 4. The single-cell topology illustrated in FIG. 3 is not limited to a 2-Way Doherty amplifier design, and can be used for any N-Way Doherty amplifier as well as any other amplifier topologies such as Chireix. The single-cell topology illustrated in FIG. 3 is also not limited to a driver-final stage arrangement, and can be expanded to N number of drivers, pre-drivers, etc. The impedance inverter 106 of the interstage matching network 104 can be implemented in any form, such as, but not limited to a quarter-wave impedance transformer like a quarter-wave transmission line or waveguide, equivalent circuit T or PI network, or any other standard impedance inverter implementation. In the case of a quarter-wave transformer, the quarter-wave transformer may or may not incorporate device parasitics to achieve the desired impedance inversion. The impedance transformation may also have 270° or any other multiple of 180° added to 90° to achieve the target impedance inversion.

The dual line-up Doherty design illustrated in FIG. 4 includes separate drivers 200, 202 for the main and peaking power amplifiers (PA) 204, 206, and respective quarter-wave transmissions lines 208, 210 between the inputs of the drivers 200, 202 and between the outputs of the amplifiers 204, 206. The load is illustrated as resistor $R_L$ in FIG. 4. One instance of the interstage matching network 104 with the impedance inverter 106 is provided between each driver 200/202 and corresponding power amplifier 204/206, as shown in FIG. 4. The advantage with the dual line-up Doherty design illustrated in FIG. 4 is that the driver 202 for the peaking amplifier 206 can be powered down when the peaking amplifier 206 is not in use. By coupling the input of each power amplifier 204/206 to the output of the corresponding driver 200/202 via a separate impedance inverter 106, each driver 200/202 will function as a (quasi) voltage source and provide a stable input voltage at the input of the corresponding power amplifier 204/206 regardless of the amplifier input impedance level.

Figure 5:
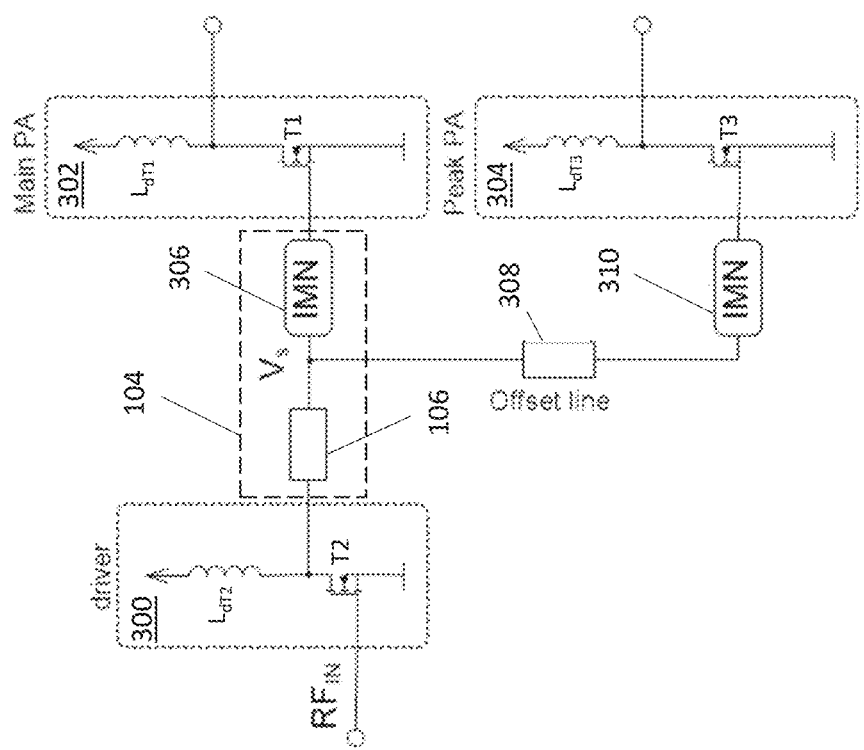
FIG. 5 illustrates a schematic diagram of the circuit of FIG. 1, configured as a single line-up Doherty design.

FIG. 5 illustrates a Doherty amplifier having a single driver 300 for all amplifiers 302, 304. The Doherty has a main power amplifier (PA) 302 and one or more peaking power amplifiers 304, each of which has a drain bias feed inductance $L_{dTx}$ for the transistor device Tx of that amplifier. The single driver 300 is coupled to the input of the main power amplifier 302 by the interstage matching network 104. The impedance inverter 106 of the interstage matching network 104 connects the driver transistor T2 of the single driver stage 300 to an intermediary node Vs between the driver stage 300 and the main amplifier 302. The interstage matching network 104 also includes an impedance matching network (IMN) 306 connecting the intermediary node Vs to the input of the main amplifier 302. The impedance matching network 306 has a phase shift of 0° or 180°.

The main power amplifier 302 typically is the major contributor to (phase) AM/PM distortion, and thus benefits greatly from a stable voltage source at the gate of the main power amplifier transistor T1. By coupling the output of the single driver 300 to node Vs using a quarter-wave transformer or other type of impedance inverter 106, the single driver 300 is transformed into a voltage source at node Vs. The impedance matching network 306 of the interstage matching network 104 for the main power amplifier 302 exhibits a zero-phase behaviour, accomplished e.g. by using a transformer, and hence the voltage source at node Vs is transformed to the gate of the power transistor T1 of the main power amplifier 302. An offset line 308 connecting node Vs to an impedance matching network (IMN) 310 for the peaking amplifier 304 may have a phase shift of 90° or of different values, e.g. −90° or 270°, depending on the combiner implementation. The offset line 308 may or may not have exactly 90° of phase. The impedance matching network 310 for the peaking amplifier 304 may provide 0° or 180° phase shift between the offset line 308 and the gate of the peaking power amplifier transistor T3.

Described next are yet additional embodiments of the interstage matching network 104. As previously explained herein, the interstage matching network 104 includes an impedance inverter 106 for providing impedance inversion between the input of a second power transistor stage 102 and the output of a first power transistor stage 100. The impedance inversion provided by the interstage matching network 104 transforms the first power transistor stage 100 from functioning as a voltage-controlled current source to functioning as a voltage-controlled voltage source at the input of the second power transistor stage 102, mitigating nonlinear effects associated with high performance semiconductor technologies. The impedance inverter 106 of the interstage matching network 104 can be a quarter-wave impedance transformer such as a quarter-wave transmission line or waveguide, a PI network which approximates a quarter-wave impedance transformer, an equivalent circuit T, etc.

Figure 6:
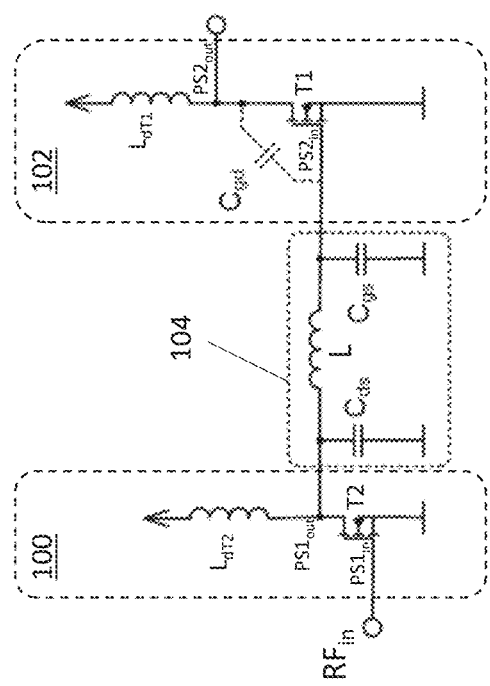
FIG. 6 illustrates a schematic diagram of the interstage matching network formed using a PI network.

FIG. 6 illustrates an implementation of the interstage matching network 104 using a PI network to form the impedance inverter 106. The PI network may include device parasitics fully or partially, used as shunt capacitors. For example, the PI network may incorporate the drain-to-source capacitance ($C_{ds}$) of the transistor device T2 of the first power transistor stage 100 and the gate-to-source capacitance ($C_{gs}$) of the transistor device T1 of the second power transistor stage 102 as shunt capacitors. The physical connection provided by, e.g., bond wires between the output $PS1_{out}$ of the first power transistor stage 100 to the input $PS2_{in}$ of the second power transistor stage 102 are represented as an inductor L in FIG. 6, and form part of the PI network. In some embodiments, the values of $C_{ds}$, $C_{gs}$ and L are such that the PI network approximates a quarter-wave transformer.

Figure 7:
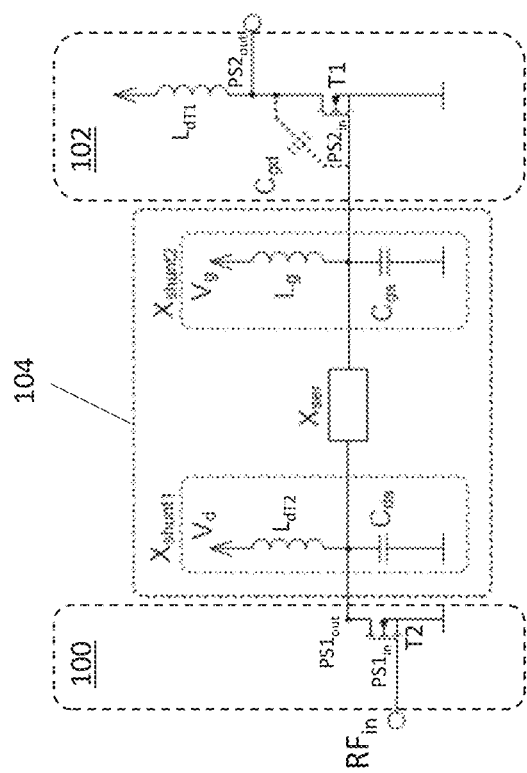
FIG. 7 illustrates a schematic diagram of the interstage matching network for a driver-amplifier stage design.

FIG. 7 illustrates another implementation of the interstage matching network 104, where the second power transistor stage 102 is configured as an RF amplifier and the first power transistor stage 100 is configured as a driver for the RF amplifier. The drain bias feed inductance $L_{dT2}$ of the driver 100 in series with the drain-to-source capacitance ($C_{ds}$) of the driver power transistor T2 forms a first shunt impedance $X_{shunt1}$. The gate bias feed inductance $L_g$ of the RF amplifier stage 102 in series with the gate-to-source capacitance ($C_{gs}$) of the amplifier power transistor T1 forms a second shunt impedance $X_{shunt2}$. The shunt impedance $X_{shunt1}$ and $X_{shunt2}$ together with series impedance $X_{ser}$, which represents the physical connection between the output $PS1_{out}$ of the driver stage 100 and the input $PS2_{in}$ of the RF amplifier stage 102, forms a PI network approximation of a quarter-wave transformer. In one embodiment, the series impedance $X_{ser}$ comprises a transmission line or waveguide having a phase response of 90°+180°*n where n is an integer greater than or equal to zero. The inductances $L_{dT2}$ and $L_g$ can be designed such that the shunt impedances $X_{shunt1}$ and $X_{shunt2}$ are either capacitive or inductive, to enable the use of an inductive or capacitive series impedance $X_{ser}$. Furthermore, the shunt impedances $X_{shunt1}$ and $X_{shunt2}$ may be designed to provide an open circuit and the series impedance $X_{ser}$ may be replaced by one or more sections of T or PI quarter-wave approximations, or by any other kind of transmission line providing a 90° transformation or multiple thereof.

Figure 8:
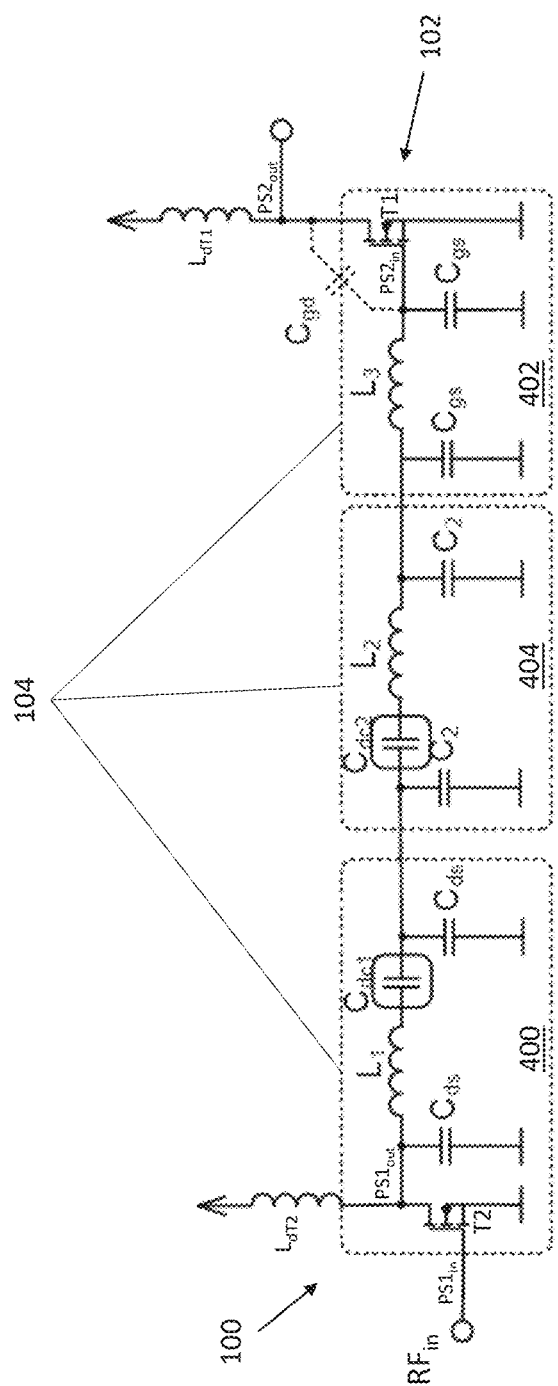
FIG. 8 illustrates a schematic diagram of the interstage matching network implemented as a multi-section quarter-wave matching network.

FIG. 8 illustrates an implementation of the interstage matching network 104 for high power devices, in which the impedance inverter 106 of the interstage matching network 104 includes a multi-section quarter-wave matching network. A first section 400 of the multi-section quarter-wave matching network is connected to the output $PS1_{out}$ of the first power stage 100, and includes a drain-to-source capacitance ($C_{ds}$) of power transistor T2 and a first series inductance $L_1$. A third section 402 of the multi-section quarter-wave matching network is connected to the input $PS2_{in}$ of the second power stage 102, and includes a gate-to-source capacitance ($C_{gs}$) of power transistor T1 and a third series inductance $L_3$. A second section 404 of the multi-section quarter-wave matching network is connected between the first and the third sections 402, 404, and includes one or more series capacitors ($C_{dCx}$) that provide DC decoupling between the first power transistor stage 100 and the second power transistor stage 102, at least one shunt capacitor ($C_2$), and a second series inductance $L_2$.

The second section 404 of the multi-section quarter-wave matching network provides any remaining impedance transformation not provided by the first and third sections 400, 402 and necessary to provide the impedance inversion between the input $PS2_{in}$ of the second power transistor stage 102 and the output $PS1_{out}$ of the first power transistor stage 100. The characteristic impedance of the first and third sections 400, 402 of the multi-section quarter-wave matching network is defined by the respective parasitics in this embodiment, and the second section 404 of the multi-section quarter-wave matching network performs the required (missing) impedance transformation. Series capacitors $C_{dc1}$ and $C_{dc2}$ provide DC decoupling between the first and second power transistor stages 100, 102, and may provide a short circuit or may be designed in such a way to deliver the required series impedance together with the series inductances. A single DC decoupling capacitor may be sufficient and may be placed at any location along the multi-section quarter-wave matching network.

Figure 9:
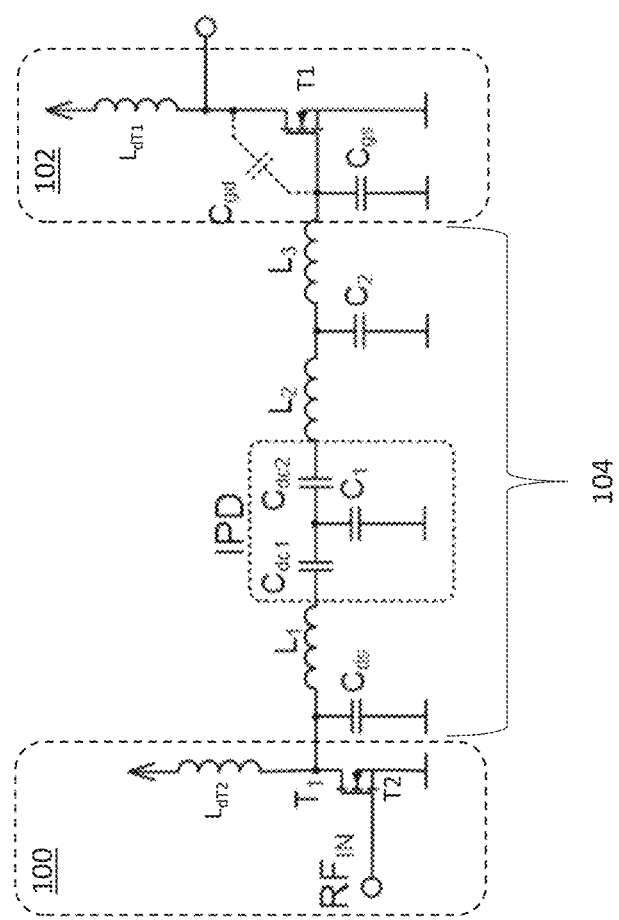
FIG. 9 illustrates a schematic diagram of the interstage matching network in FIG. 8, in which the series and shunt capacitors of the impedance inverter are disposed in a single integrated passive device.

FIG. 9 illustrates an embodiment of the interstage matching network 104 shown in FIG. 8, in which the series and shunt capacitors $C_{dc1}$, $Cd_{c2}$ and $C_2$ are disposed in a single integrated passive device (IPD) to optimally use the available space. The series inductances $L_1$, $L_2$ and $L_3$ can be formed by bond wire connections of a semiconductor package for the circuit.

Figure 10:
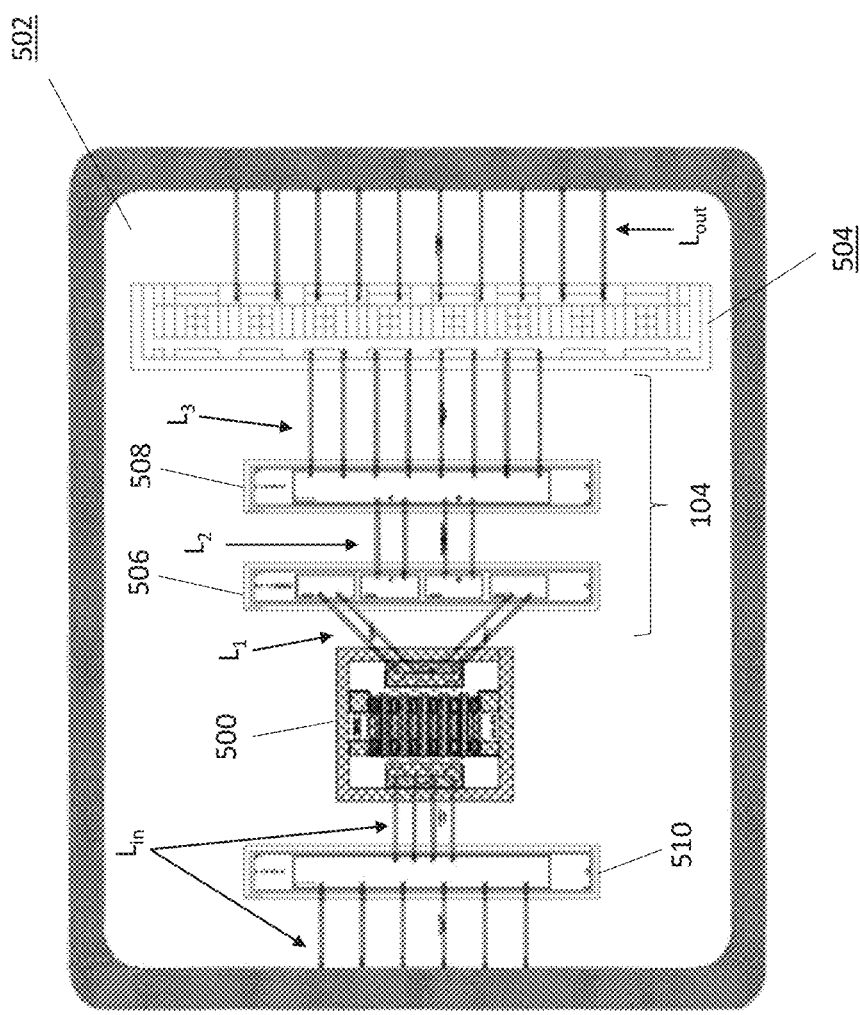
FIG. 10 illustrates a schematic diagram of a semiconductor package including the first and second power transistor stages and the interstage matching network.

FIG. 10 illustrates an embodiment of a semiconductor package. The semiconductor package includes a first semiconductor die 500 mounted to a substrate 502 such as a metal flange, a second semiconductor die 504 mounted to the substrate 502 and the interstage matching network 104 described herein. The first semiconductor die 500 includes a first power transistor stage internally configured to function as a voltage-controlled current source. The second semiconductor die 504 includes a second power transistor stage having an input impedance which varies as a function of input power. The interstage matching network 104 couples the output of the first power transistor stage to the input of the second power transistor stage, and provides impedance inversion between the input of the second power transistor stage and the output of the first power transistor stage as previously described herein. The impedance inversion provided by the interstage matching network 104 transforms the first power transistor stage from functioning as a voltage-controlled current source to functioning as a voltage-controlled voltage source at the input of the second power transistor stage.

Part of the interstage matching network 104 is formed by bond wire connections $L_1$, $L_2$ and $L_3$ between the first and second semiconductor dies 500, 504. Additional bond wire connections $L_{in}$, $L_{out}$ provide input connections for the first semiconductor die 500 and output connections for the second semiconductor die 504. The IPD shown in FIG. 9 corresponds to IPD die 506 in FIG. 10, and shunt capacitor $C_2$ in FIG. 9 corresponds to capacitor die 508 in FIG. 10. Also shown in FIG. 10 is an input shunt capacitor die 510 for the first semiconductor die 500.

Various embodiments of the interstage matching network are described herein. The interstage matching network can be used in many applications, including but not limited to N-way Doherty amplifiers, single or multi-line driver to power stage coupling, pre-driver to driver coupling, coupling between any number of power transistor stages, etc. For RF power applications, the interstage matching network can support 4G (4$^{th}$ generation), 5G (5$^{th}$ generation), MIMO systems, etc., including but not limited to the following cellular and millimetre frequency bands: 600 MHz; 700 MHz; 800 MHz; 900 MHz; 1.5 GHz; 2.1 GHz; 2.3 GHz; 2.6 GHz; 3.6 GHz; 4.7 GHz; 26 GHz; 28 GHz; 37 GHz; 39 GHz; 60 GHz.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit, comprising:
a first power transistor stage internally configured to function as a voltage-controlled current source;
a second power transistor stage having an input impedance which varies as a function of input power; and
an interstage matching network coupling an output of the first power transistor stage to an input of the second power transistor stage,
wherein the interstage matching network is configured to provide impedance inversion between the input of the second power transistor stage and the output of the first power transistor stage,
wherein the impedance inversion provided by the interstage matching network transforms the first power transistor stage from functioning as the voltage-controlled current source to functioning as a voltage-controlled voltage source at the input of the second power transistor stage,
wherein the first power transistor stage is a driver stage and the second power transistor stage is an RF power amplifier stage,
wherein the RF power amplifier stage comprises a Doherty amplifier having a main amplifier and at least one peaking amplifier,
wherein the driver stage comprises a separate driver for each amplifier of the Doherty amplifier,
wherein the interstage matching network comprises a separate impedance inverter coupled between each driver of the driver stage and each amplifier of the Doherty amplifier.

2. The circuit of claim 1, wherein the driver stage comprises an LDMOS transistor configured to function as the voltage-controlled current source, and wherein each amplifier of the Doherty amplifier comprises a III-V semiconductor transistor configured as an RF power amplifier.

3. The circuit of claim 1, wherein the driver stage comprises a first LDMOS transistor configured to function as the voltage-controlled current source, and wherein each amplifier of the Doherty amplifier comprises a second LDMOS transistor configured as an RF power amplifier.

4. The circuit of claim 1, wherein the driver stage comprises a first III-V semiconductor transistor configured to function as the voltage-controlled current source, and wherein each amplifier of the Doherty amplifier comprises a second III-V semiconductor transistor configured as an RF power amplifier.

5. The circuit of claim 1, wherein the interstage matching network has a phase response of 90°+180° *n where n is an integer greater than or equal to zero.

6. The circuit of claim 1, wherein the interstage matching network comprises an impedance inverter coupled between the input of the second power transistor stage and the output of the first power transistor stage.

7. The circuit of claim 6, wherein the impedance inverter comprises a quarter-wave impedance transformer.

8. The circuit of claim 6, wherein the impedance inverter comprises a PI network.

9. The circuit of claim 8, wherein the PI network comprises a drain-to-source capacitance of the first power transistor stage and a gate-to-source capacitance of the second power transistor stage.

10. The circuit of claim 8, wherein the PI network comprises a first shunt impedance formed by a drain bias feed inductance of the first power transistor stage and a drain-to-source capacitance of the first power transistor stage, a second shunt impedance formed by a gate bias feed inductance of the second power transistor stage and a gate-to-source capacitance of the second power transistor stage, and a series impedance between the input of the second power transistor stage and the output of the first power transistor stage.

11. The circuit of claim 10, wherein the first and the second shunt impedances are designed to provide an open circuit, and wherein the series impedance comprises a transmission line or waveguide having a phase response of 90°+180° *n where n is an integer greater than or equal to zero.

12. The circuit of claim 6, wherein the impedance inverter comprises a multi-section quarter-wave matching network, wherein a first section of the multi-section quarter-wave matching network is connected to the output of the first power stage and comprises a drain-to-source capacitance of the first power transistor stage and a first series inductance, wherein a third section of the multi-section quarter-wave matching network is connected to the input of the second power stage and comprises a gate-to-source capacitance of the second power transistor stage and a third series inductance, and wherein a second section of the multi-section quarter-wave matching network is connected between the first and the third sections and comprises one or more series capacitors that provide DC decoupling between the first power transistor stage and the second power transistor stage, at least one shunt capacitor and a second series inductance, and wherein the second section is configured to provide any remaining impedance transformation not provided by the first and the third sections and necessary to provide the impedance inversion between the input of the second power transistor stage and the output of the first power transistor stage.

13. The circuit of claim 12, wherein the one or more series capacitors and the shunt capacitor are disposed in a single integrated passive device.

14. The circuit of claim 12, wherein the first, the second and the third series inductances are formed by bond wire connections of a semiconductor package for the circuit.

15. A semiconductor package, comprising:
a first semiconductor die comprising a first power transistor stage internally configured to function as a voltage-controlled current source, the first semiconductor die being mounted to a substrate;
a second semiconductor die comprising a second power transistor stage having an input impedance which varies as a function of input power, the second semiconductor die being mounted to the substrate; and
an interstage matching network coupling an output of the first power transistor stage to an input of the second power transistor stage,
wherein the interstage matching network is configured to provide impedance inversion between the input of the second power transistor stage and the output of the first power transistor stage,
wherein the impedance inversion provided by the interstage matching network transforms the first power transistor stage from functioning as the voltage-controlled current source to functioning as a voltage-controlled voltage source at the input of the second power transistor stage,
wherein part of the interstage matching network is formed by bond wire connections between the first and the second semiconductor dies.

* * * * *